United States Patent [19]
Hatano et al.

[11] Patent Number: 5,273,933
[45] Date of Patent: Dec. 28, 1993

[54] VAPOR PHASE GROWTH METHOD OF FORMING FILM IN PROCESS OF MANUFACTURING SEMICONDUCTOR DEVICE

[75] Inventors: Ako Hatano; Toshihide Izumiya, both of Tokyo; Yasuo Ohba, Yokohama, all of Japan

[73] Assignee: Kabushiki Kaisha Toshiba, Kawasaki, Japan

[21] Appl. No.: 917,321

[22] Filed: Jul. 23, 1992

[30] Foreign Application Priority Data

Jul. 23, 1991 [JP] Japan ................................ 3-181411

[51] Int. Cl.$^5$ ............................................. H01L 21/20
[52] U.S. Cl. ..................... 437/127; 437/133; 437/942; 437/129; 437/31
[58] Field of Search ............... 437/126, 133, 942, 127, 437/129; 148/DIG. 113, DIG. 114

[56] References Cited
U.S. PATENT DOCUMENTS 4,569,855  2/1986  Matsuda et al. .................... 437/942

OTHER PUBLICATIONS

Extended Abstracts (The 38th Spring Meeting, 1991); The Japan Society of Applied Physics and Related Societies 29p-V-13; R. Ishihara et al. "Low Temperature CVD of SiN using new source gas (Hydrogen Azide)" (date unknown).
Journal of Crystal Growth 107 (1991) 376-380; K. L. Ho et al., "MOVPE of AlN and GaN by using novel precursors".

Primary Examiner—Olik Chaudhuri
Assistant Examiner—Ramamohan Rao Paladugu
Attorney, Agent, or Firm—Oblon, Spivak, McClelland, Maier & Neustadt

[57] ABSTRACT

In a process of manufacturing a short-wavelength-light emitting element, n- and p-type GaInAlN films are formed on a substrate made of SiC, using an MOCVD method. $(CH_3)_3SiN_3$ is used as raw material for nitrogen. The films are grown at a relatively low temperature and the amount of nitrogen doped in the films is increased.

14 Claims, 6 Drawing Sheets

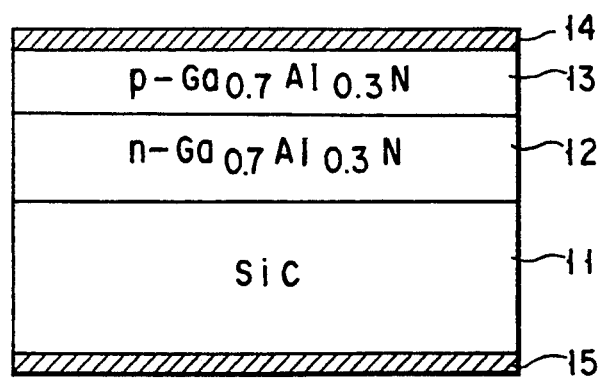
F I G. 1
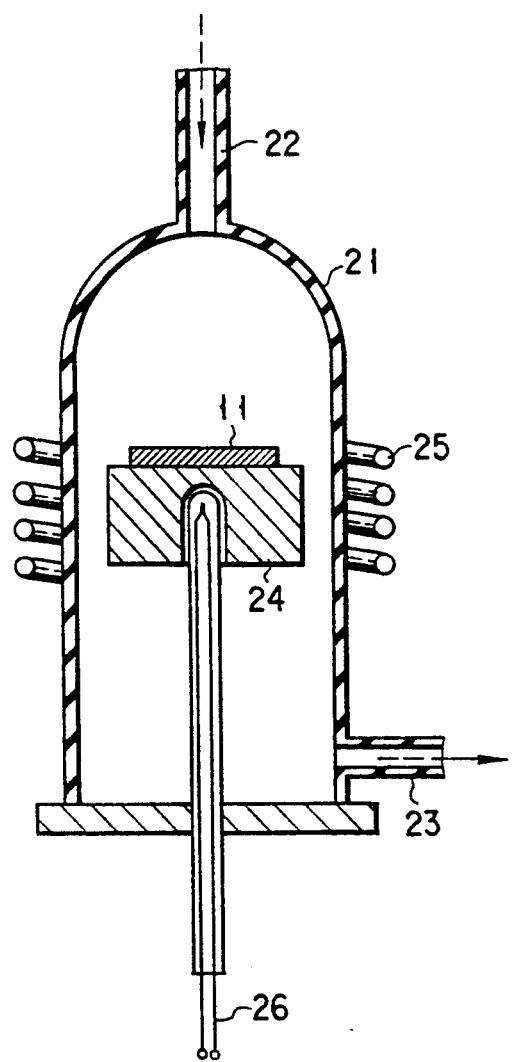
F I G. 2

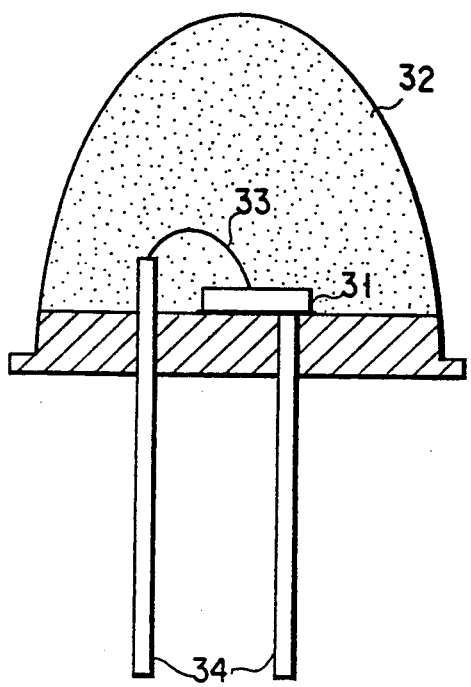
F I G. 3
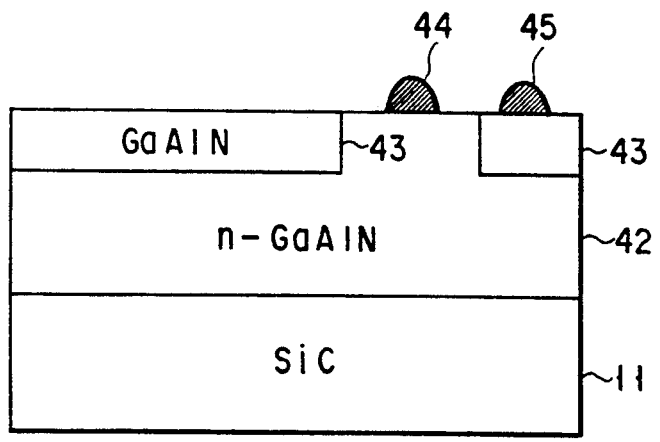
F I G. 4

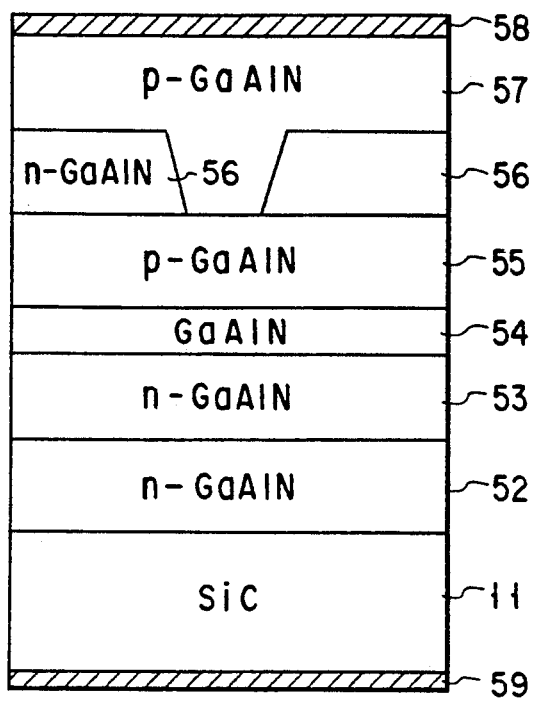
F I G. 5
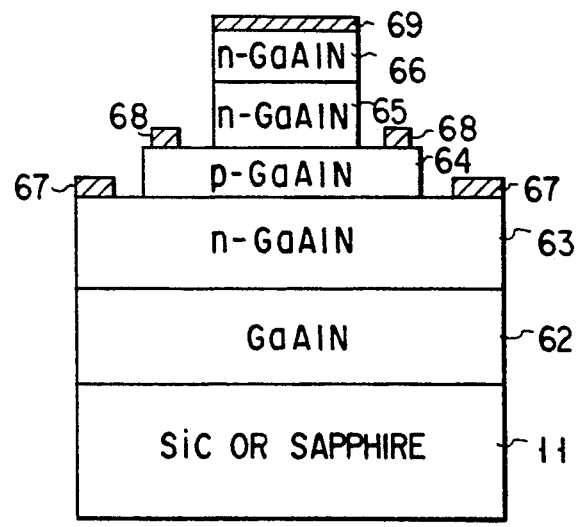
F I G. 6

VAPOR PHASE GROWTH METHOD OF FORMING FILM IN PROCESS OF MANUFACTURING SEMICONDUCTOR DEVICE

BACKGROUND OF THE INVENTION

1. Field of the Invention

The present invention relates to a vapor phase growth method of forming a film in a process of manufacturing a semiconductor device, and more specifically to a method of manufacturing a semiconductor light emitting element including a group III-V compound film containing nitrogen as a group V element.

2. Description of the Related Art

In recent years, with the development of high-speed and high-density data process systems, there has been a growing demand for laser devices which can generate beams having short wavelengths. In order to achieve miniaturization, lightness of weight, and power-saving, it is essential to produce a short-wavelength laser from a semiconductor device. It is preferable to use a nitride-based mixed crystal made of GaAlInN as the material of a short-wavelength-light emitting element, since it can be controlled to form a band gap of a range as broad as from 2.2 to 6.0 eV. Further, it is preferable to use SiN to form the final passivation film and the gate insulating film of the semiconductor device, since SiN has superior dielectric and diffusion barrier characteristics. When SiN is used to form the passivation film, growing it at a low temperature is especially important. Ammonia is used as a raw material for producing nitrogen to be contained in the nitride layer. It is desirable to grow a layer containing nitrogen at as low a temperature as possible, since growing the layer at high temperature will cause nitrogen to evaporate from the crystal. However, an ammonia molecule has three equivalent H—N bonds and is stable, with the result that the decomposition temperature is very high, and thus a considerable great amount of ammonia is required for growing the film at low temperature.

As should be clear from the above, the use of ammonia to grow a short-wavelength-light emitting element and the passivation film of a semiconductor device is disadvantageous in that a great amount of ammonia is required to achieve low temperature growth of the films by preventing evaporation of nitrogen from the crystal.

SUMMARY OF THE INVENTION

It is accordingly the object of the invention to provide a crystal-growing method superior in controllability by the use of a material containing nitrogen instead of ammonia, thereby forming a nitride layer of a good quality.

The method of the invention is a vapor-phase growth method of growing a film containing nitrogen on a substrate, for use in manufacturing a semiconductor device; wherein an organic metal compound containing an azide group represented by $R_3MN_3$ (where R is an alkyl group, and M is an element belonging to group IV) is used as material for producing nitrogen.

According to the invention, vapor-phase growth can be performed at a relatively low temperature, thereby increasing the amount of nitrogen doped in the nitride layer. Thus, there can be provided high-quality nitride layers, having pn junctions, in the short-wavelength-light emitting element, or a high-quality passivation film in a semiconductor device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic cross-sectional view showing an LED according to a first embodiment of the invention;

FIG. 2 is a schematic cross-sectional view showing a growth device;

FIG. 3 is a cross-sectional view showing an LED chip embedded in a resin case;

FIG. 4 is a schematic cross-sectional view showing an LED according to a second embodiment of the invention;

FIG. 5 is a schematic cross-sectional view showing a semiconductor laser according to a third embodiment of the invention;

FIG. 6 is a schematic cross-sectional view showing a bipolar transistor according to a fourth embodiment of the invention;

DETAILED DESCRIPTION OF THE PREFERRED EMBODIMENT

Figure 7:
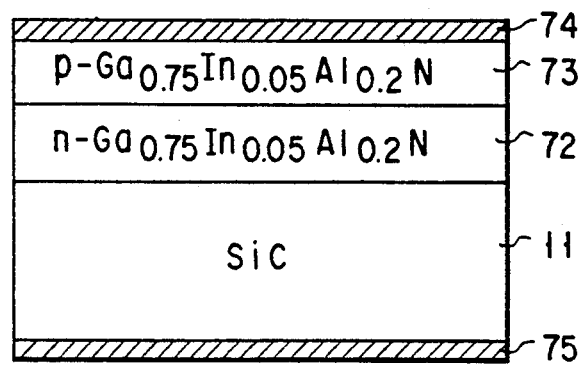
FIG. 7 is a schematic cross-sectional view showing an LED according to a fifth embodiment of the invention.

The essence of the invention is the use, as a raw material for nitrogen, of an organic metal compound containing an azide group such as $R_3MN_3$ (R represents an alkyl group, M a group IV element), at the time of forming a nitride layer of an element by a vapor phase growth method (e.g. MOCVD method). This being so, nitrogen is positively doped into the crystal, thereby to provide a nitride layer of a good quality. Application of the invention to forming of a film of a III-V group compound will produce a semiconductor element of a high quality.

The reason why the decomposition temperature of ammonia is high is that an ammonia molecule consists of three equivalent H-N bonds and hence is a stable molecule. On the other hand, the bonds of the azide group are arranged linear (—N=N=N) and hence a nitrogen atom is liable to be separated therefrom. Thus, the decomposition temperature of the azide group is low.

Hydrogen azide, which is a compound of the azide group and hydrogen, is very explosive, and must be kept at a low temperature of $-80°$ C. or less. Thus, it is difficult to bring the use of the compound into practice in a stable manner. An organic metal azide compound such as trimethylsilylazide $(CH_3)_3SiN_3$ is a material containing the azide group and relatively stable at room temperature. Trimethylsilylazide contains Si and C, and they may be doped into a resultant nitride layer. However, the inventors studied and found that the degree of contamination of Si and C can be sufficiently reduced under suitable conditions. Specifically, they tried to dope Si into a III-V group compound semiconductor under a condition by using tetramethylsilane $((CH_3)_4Si)$ and trimethylsilane $((CH_3)_3SiH)$ as doping raw materials, but Si was not doped therein. This means that the trimethylsilyl group is a stable substance, and that only nitrogen can selectively be doped into the semiconductor under suitable conditions when trimethylsilylazide is used as material for extracting nitrogen therefrom. Also in the case of using an azide compound containing IV group elements such as C and Ge, as well as Si, i.e., using, for example, $(CH_3)_3CN_3$, $(CH_3)_3GeN_3$, $(CH_3)_2CHSiN_3$, $(CH_2H_5)_3SiN_3$, or $(CH_3)_3CH_2SiN_3$, only nitrogen can be selectively doped under suitable conditions.

In addition, in the case of using trimethylsilylazide, Si can be doped into the crystal effectively under certain conditions, so that a SiN (silicon nitride) film can be grown by using only trimethylsilylazide.

As described above, the method of the invention can increase the degree of doping of nitrogen into the crystal, and provide a short-wavelength-light emitting element of high quality or a passivation film of high quality. Thus, the invention can meet various requirements in the art.

FIG. 2 schematically shows a growth device to be used for effecting the vapor phase growth method of the invention. Reference numeral 21 denotes a reaction tube (reactor) made of quartz. This reaction tube has a gas inlet 22 through which a mixture gas of raw materials is took in and a gas outlet 23 through which the gas is exhausted. A susceptor 24 made of carbon is located in the reaction tube 21. A sample substrate 11 is placed on the susceptor 24. The susceptor 24 is disposed to be heated by induction heating by the use of a high frequency coil 25.

Then, a crystal growth method performed in the above device will be explained.

A substrate 11 made of SiC and having its surface cleaned by chemical etching is placed onto the susceptor 24. 2.5 l/min of high purity hydrogen is guided into the reaction tube 21 through the gas inlet 22, thereby replacing therewith the air contained in the tube. Thereafter, a rotary pump (not shown) connected to the gas outlet 23 is operated, thereby reducing pressure in the tube 21 to 20-300 torr. Then, high purity hydrogen is took into the tube through the inlet 22, and the substrate 11 and susceptor 24 are heated by the high frequency coil 25. The substrate 11 is cleaned at a substrate temperature of $1000°-1250°$ C. for 30 minutes. Then, the hydrogen gas is replaced with an ammonia gas, and nitriding of the substrate is performed for 1-10 minutes at a substrate temperature of $1000°-1300°$ C. The nitriding of the substrate may be unnecessary. Subsequently, raw materials such as $Ga(CH_3)_3$, $(CH_3)_3SiN_3$, etc., are guided to grow a film. The temperature of the substrate 11 is measured by a thermocouple 26 and controlled by a device (not shown).

FIG. 1 shows an LED according to a first embodiment of the invention. An n-$Ga_{0.7}Al_{0.3}N$ layer 12 (doped with nothing or with Si of an amount falling within a range of $1 \times 10^{16} - 1 \times 10^{19}$ cm$^{-3}$, e.g., $1 \times 10^{17}$ cm$^{-3}$) having a thickness of 3 $\mu$m is formed on the SiC substrate 11, and a p-$Ga_{0.7}Al_{0.3}N$ layer 13 (doped with Mg of an amount falling within a range of $1 \times 10^{16} - 1 \times 10^{19}$ cm$^{-3}$, e.g., $1 \times 10^{17}$ cm$^{-3}$) having a thickness of 2 $\mu$m is formed on the layer 12. The layers 12 and 13 form the p-n junction of the LED. Reference numerals 14 and 15 denote metal electrodes.

Specifically, to form the LED shown in FIG. 1, $1 \times 10^{-5}$ mol/min of $Ga(CH_3)_3$, $1 \times 10^{-3}$ mol/min of $(CH_3)_3SiN_3$, and $1 \times 10^{-6}$ mol/min of $Al(CH_3)_3$ were supplied into the tube, the substrate temperature was set to $750°$ C., the pressure in the tube to 75 torr, and the total flow of the material gas to 1 l/min. As dopants, Si was used for the n-conductive type and Mg for the p-conductive type. Si was doped by supplying into the tube a mixture of the material gas and silane $(SiH_4)$, while Mg was doped by guiding a mixture of the material gas and cyclopentadienylmagnesium $(Cp_2Mg)$.

FIG. 3 shows an LED chip 31 embedded in a resin case 32 serving as a lens. In the figure, reference numeral 33 denotes an internal lead, and reference numeral 34 external leads.

Blue light of approx. 5 mcd is emitted by the LED embedded in the resin case.

Though, in the above embodiment, an n-type substrate is employed, the invention can also employ a p-type substrate. Further, the band gap can be varied with its grating constant maintained as it is, by adding In to GaAlN.

FIG. 4 shows an MIS-type LED according to a second embodiment of the invention. An n-$Ga_{0.7}Al_{0.3}N$ layer 42 (either undoped or doped with Si of an amount falling within a range of $1 \times 10^{16} - 1 \times 10^{19}$ cm$^{-3}$, e.g., $1 \times 10^{17}$ cm$^{-3}$) having a thickness of 3 $\mu$m is formed on an SiC substrate 11, and a high resistance portion 43 is formed in part of the layer 42. Reference numerals 44 and 45 denote metal electrodes.

FIG. 5 shows a semiconductor layer device according to a third embodiment of the invention. An n-GaAlN buffer layer 52, an n-GaAlN clad layer 53, an undoped GaAlN active layer 54, a p-clad layer 55, an n-GaAlN current interrupting layer 56, and a p-GaAlN contact layer 57 are formed on an SiC substrate 11. Reference numerals 58 and 59 denote metal electrodes.

FIG. 6 shows a bipolar transistor according to a fourth embodiment of the invention. An undoped GaAlN buffer layer 62, an n-GaAlN collector layer 63, a p-GaAlN base layer 64, an n-GaAlN emitter layer 65, and an n-GaAlN emitter contact layer 66 are formed on an SiC or sapphire substrate 11. Reference numerals 67-69 denote metal electrodes.

FIG. 7 shows an LED according to a fifth embodiment of the invention. An n-$Ga_{0.75}In_{0.05}Al_{0.2}N$ layer 72 (either undoped or doped with Si of an amount falling within a range of $1 \times 10^{16} - 1 \times 10^{19}$ cm$^{-3}$, e.g., $1 \times 10^{17}$ cm$^{-3}$) having a thickness of 3 $\mu$m is formed on an SiC substrate 11, and a p-$Ga_{0.75}In_{0.05}Al_{0.2}N$ layer 73 (doped with Mg of an amount falling within a range of $1 \times 10^{16} - 1 \times 10^{19}$ cm$^{-3}$, e.g., $1 \times 10^{17}$ cm$^{-3}$) having a thickness of 2 $\mu$m is formed on the layer 72. The layers 72 and 73 form the p-n junction of the LED. Reference numerals 74 and 75 denote metal electrodes.

Specifically, to form the LED shown in FIG. 7, $5 \times 10^{-7}$ mol/min of $In(CH_3)_3$, $7.5 \times 10^{-6}$ mol/min of $Ga(CH_3)_3$, $1 \times 10^{-3}$ mol/min of $(CH_3)_3SiN_3$, and $2 \times 10^{-6}$ mol/min of $Al(CH_3)_3$ were supplied into the tube, the substrate temperature was set to 800° C., the pressure in the tube to 75 torr, and the total flow of the material gas to 1 l/min. Si was used as the n-type dopant, and Mg as the p-type dopant. Si was doped by drawing into the tube a mixture of the material gas and silane ($SiH_4$), while Mg was doped by supplying a mixture of the material ga and cyclopentadienylmagnesium ($Cp_2Mg$).

A nitride layer containing In cannot be grown at a temperature of 1000° C. or more, since InN is evaporated at low temperature. In this embodiment, the nitride layer is grown at 800° C. In such a low-temperature growth, if $NH_3$ were used as the raw material of the nitride layer, a large amount of $NH_3$ would be required since the decomposition temperature thereof is high. Therefore, in the embodiment, $(CH_3)_3SiN$, which has a low decomposition temperature, is used, facilitating growth of the nitride layer containing In.

In the vapor phase growth method of the invention, a plasma CVD method can also be used to grow a SiN film (to be used as e.g. a passivation film), employing $(CH_3)_3SiN_3$. In this case, the amount of doped Si is larger than in the case where a thermal CVD method is used, and hence $(CH_3)_3SiN_3$ can be used as a raw material for Si and N. Thus, the plasma method is advantageous in respect of cost. Moreover, the SiN film can be formed using $(CH_3)_3SiN_3$ and employing a light CVD method, thereby providing an effect similar to the above.

Though, in the embodiments, the substrate is made of SiC, it may be made of Si, GaAs, GaP, $MgF_2$, MnO, or $TiO_2$ if $(CH_3)_3SiN_3$, which enables low temperature growth of a film, is used. A sapphire substrate may also be used.

Figure 8:
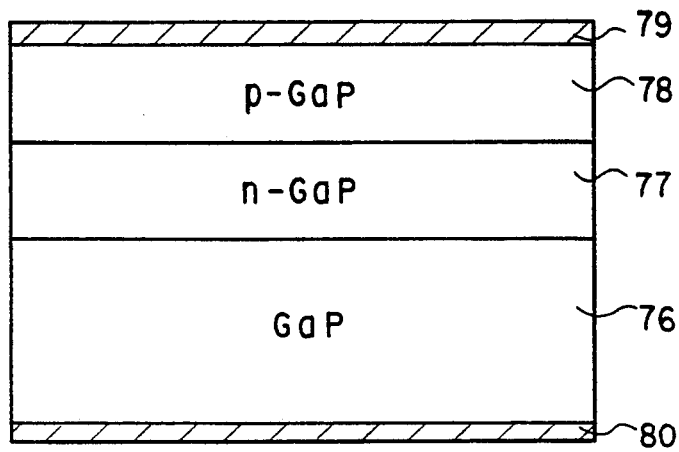
FIG. 8 is a schematic cross sectional view showing an LED according to a sixth embodiment.

FIG. 8 is a schematic cross sectional view, showing a sixth embodiment according to the invention. An n-GaP layer 77 having a thickness of 3 μm (doped with S of an amount falling within a range of $1 \times 10^{16} - 1 \times 10^{19}$ cm$^{-3}$, e.g., $1 \times 10^{17}$ cm$^{-3}$ and with N of an amount falling within a range of $5 \times 10^{18} - 1 \times 10^{19}$ cm$^{-3}$, e.g., $1 \times 10^{19}$ cm$^{-3}$) is formed on an n-GaP substrate 76. A p-GaP layer 78 having a thickness of 2 μm (doped with Zn of an amount falling within a range of $1 \times 10^{16} - 1 \times 10^{19}$ cm$^{-3}$, e.g., $1 \times 10^{17}$ cm$^{-3}$ and with N of an amount falling within a range of $5 \times 10^{18} - 1 \times 10^{19}$ cm$^{-3}$, e.g., $1 \times 10^{19}$ cm$^{-3}$) is formed on the n-GaP layer 77. Reference numerals 79 and 80 denote metal electrodes.

Actually, the LED shown in FIG. 8 was grown by supplying, as materials, $Ga(CH_3)_3$ of an amount of $2 \times 10^{-5}$ mol/min and $PH_3$ of an amount of $4 \times 10^{-5}$ mol/min. The temperature of the substrate was set at 700° C., the pressure at 75 torr, and the total flow of the material gases at 1 l/min. $(CH_3)_3SiN_3$ of an amount falling within a range of $1 \times 10^{-7} - 4 \times 10^{-5}$ mol/min was used as a dopant gas, and was mixed into the material gases. Thus, an LED capable of emitting green light was formed. Though an element made of Gap is used in this embodiment, the invention is also applicable to doping with N a semiconductor element made of any other III-V group compound, e.g. $GaAs_{1-x}P_x$ ($0 \leq x \leq 1$).

The LED chip according to the sixth embodiment was caused to emit light, with the chip embedded in the resin case 32 serving also as a lens, as is shown in FIG. 3. Reference numeral 33 denotes an internal lead, reference numeral 34 an external lead, and reference numeral 31 an LED chip according to the sixth embodiment. Blue light of approx. 5mcd was emitted from the LED.

Though the substrate used in the embodiment is of the n-type, a p-type substrate may be used in place of it.

Figure 9:
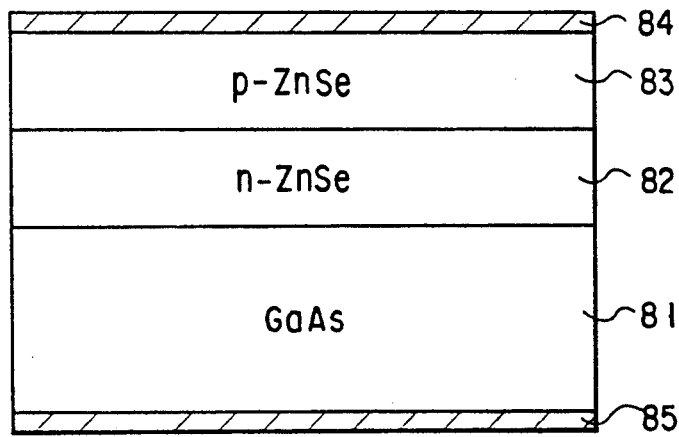
FIG. 9 is a schematic cross sectional view showing an LED according to a seventh embodiment.

FIG. 9 is a schematic view, showing an LED according to a seventh embodiment of the invention and obtained by doping with N in a manner similar to that of the sixth embodiment. Specifically, an n-ZnSe layer 82 (undoped) having a thickness of 3 μm is formed on a GaAs substrate 81. A p-ZnSe layer 83 having a thickness of 2 μm (doped with N of an amount falling within a range of $1 \times 10^{16} - 1 \times 10^{19}$ cm$^{-3}$, e.g., $1 \times 10^{17}$ cm$^{-3}$) is formed on the n-ZnSe layer 82. Reference numerals 84 and 85 denote metal electrodes.

Actually, the LED shown in FIG. 9 was grown by supplying, as materials, $Zn(CH_3)_2$ of an amount of $2 \times 10^{-5}$ mol/min and $Se(CH_3)_2$ of an amount of $4 \times 10^{-5}$ mol/min. The temperature of the substrate was set at 500° C., the pressure at 75 torr, and the total flow of the material gases at 1 l/min. $(CH_3)_3SiN_3$ of an amount falling within a range of $1 \times 10^{-7} - 4 \times 10^{-5}$ mol/min was used as a dopant gas, and was mixed into the material gases. Also in this case, a good light-emitting LED could be formed.

Figure 10:
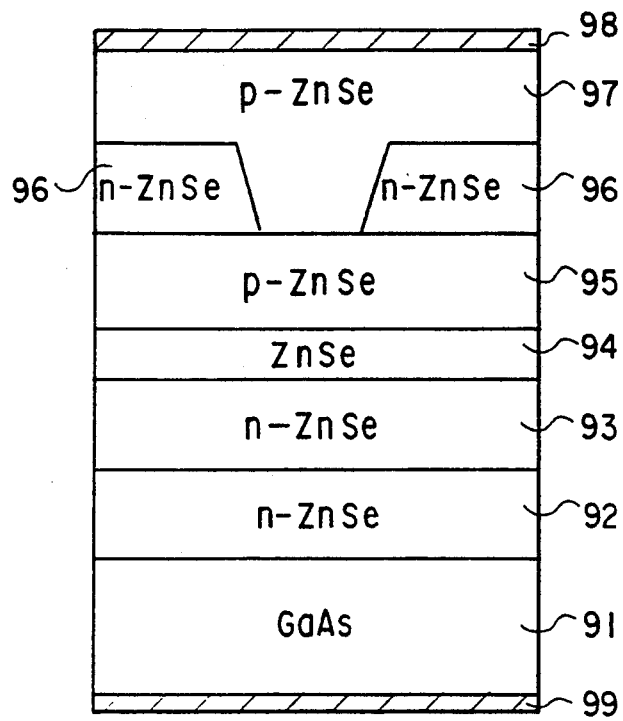
FIG. 10 is a schematic cross sectional view showing a semiconductor laser according to an eighth embodiment.

FIG. 10 is a schematic view, showing a semiconductor laser according to an eighth embodiment of the invention and obtained by doping with N in a manner similar to that in the sixth embodiment. Specifically, an n-ZnSe buffer layer 92, an n-ZnSe clad layer 93, an undoped ZnSe active layer 94, a p-ZnSe clad layer 95, an n-ZnSe current insulation layer 96, and a p-ZnSe contact layer 97 are formed on a GaAs substrate 91 in the order mentioned. Reference numerals 98 and 99 designate metal electrodes. These ZnSe layers can be formed as in the seventh embodiment.

Though ZnSe is used in the seventh and eighth embodiments, any other II-VI group compound, e.g. $ZnS_xSe_{1-x}$ ($0 \leq x \leq 1$), may be used instead. Similarly, a substrate made of a II-VI group compound such as ZnSe may be used in place of the GaAs substrate.

Figure 11:
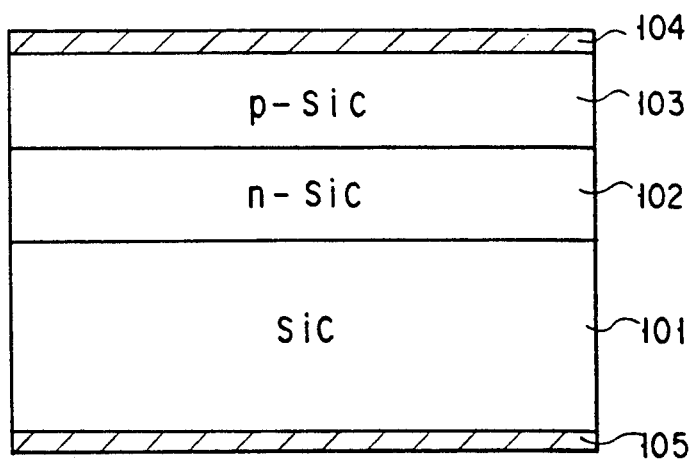
FIG. 11 is a schematic cross sectional view showing an LED according to a ninth embodiment.

FIG. 11 is a schematic cross sectional view, showing an LED according to a ninth embodiment of the invention and obtained by doping with N in a manner similar to that in the sixth embodiment. An n-SiC layer 102 having a thickness of 3 μm (doped with N of an amount falling within a range of $5 \times 10^{18} - 5 \times 10^{19}$ cm$^{-3}$, e.g., $1 \times 10^{19}$ cm$^{-3}$ and with Al of an amount falling within a range of $1 \times 10^{17} - 1 \times 10^{19}$ cm$^{-3}$, e.g., $5 \times 10^{18}$ cm$^{-3}$) is formed on an n-SiC substrate 101. A p-SiC layer 103 having a thickness of 2 μm (doped with Al of an amount falling within a range of $5 \times 10^{18} - 5 \times 10^{19}$ cm$^{-3}$, e.g., $1 \times 10^{19}$ cm$^{-3}$) is formed on the n-SiC layer 102. Reference numerals 104 and 105 denote metal electrodes.

Though the substrate used in this embodiment is of the n-type, a p-type substrate may be used in place of it.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A MOCVD method of growing on a substrate a III-V group compound film containing InN, for use in forming a light emitting layer of a semiconductor light emitting element;

wherein an organic metal compound containing an azide group and represented by $R_3SiN_3$ (wherein R is an alkyl group) is used as material for N contained in said compound film, and conditions for forming said compound film are set such that said organic metal compound is decomposed to release N therefrom and to maintain bonding between said alkyl group and Si so that Si contained in said organic metal compound is not taken into said compound film.

2. A method according to claim 1, wherein $(CH_3)_3SiN_3$ is used as said organic metal compound.

3. A method according to claim 2, wherein the temperature of said substrate during growth of said film is set at not more than 1000° C.

4. A method according to claim 3, wherein said method is a method of forming a first film of a first conductivity type and a second film of a second conductivity type, which constitute a PN junction of said light emitting layer of a semiconductor light emitting element, said first and second films being made of GaInAlN, said method comprising the steps of:
   receiving said substrate in a reaction vessel;
   forming said first film by introducing into the reaction vessel material gases containing $In(CH_3)_3$, $Ga(CH_3)_3$, $(CH_3)_3SiN_3$, $Al(CH_3)_3$, and a first conductivity-type dopant; and
   forming said second film by introducing into the reaction vessel material gases containing $In(CH_3)_3$, $Ga(CH_3)_3$, $(CH_3)_3SiN_3$, $Al(CH_3)_3$, and a second conductivity-type dopant.

5. A method according to claim 4, wherein said first and second conductivity type dopants are Si and Mg, respectively.

6. A method according to claim 5, wherein silane is used as material for Si as said first conductivity type dopant.

7. A method according to claim 5, wherein cyclopentadienylmagnesium is used as material for Mg as said second conductivity type dopant.

8. A MOCVD method of growing on a substrate a first film of a first conductivity type and a second film of a second conductivity type, which constitute a PN junction of a semiconductor light emitting element and are made of III-V group compound containing InN, said method comprising the steps of:
   receiving said substrate in a reaction vessel;
   forming said first film by introducing material gases into the reaction vessel; and
   forming said second film by introducing material gases into the reaction vessel;
   wherein an organic metal compound containing an azide group and represented by $R_3SiN_3$ (where R is an alkyl group) is used as material for N contained in each of said first and second films, and conditions for forming each of said first and second films are set such that said organic metal compound is decomposed to release N therefrom and to maintain bonding between said alkyl group and Si so that Si contained in said organic metal compound is not taken into each of said first and second films.

9. A method according to claim 8, wherein $(CH_3)_3SiN_3$ is used as said organic metal compound.

10. A method according to claim 9, wherein the temperature of said substrate during growth of each of said first and second films is set at not more than 1000° C.

11. A method according to claim 10, wherein each of said first and second films is made of GaInAlN, said material gases for forming said first film contain $In(CH_3)_3$, $Ga(CH_3)_3$, $(CH_3)_3SiN_3$, $Al(CH_3)_3$, and a first conductivity-type dopant, and said material gases for forming said second film contain $In(CH_3)_3$, $Ga(CH_3)_3$, $(CH_3)_3SiN_3$, $Al(CH_3)_3$, and a second conductivity-type dopant.

12. A method according to claim 11, wherein said first and second conductivity type dopants are Si and Mg, respectively.

13. A method according to claim 12, wherein silane is used as material for Si as said first conductivity type dopant.

14. A method according to claim 12, wherein cyclopentadienylmagnesium is used as material for Mg as said second conductivity type dopant.

* * * * *